(12) United States Patent
Chen

(10) Patent No.: US 8,786,081 B2
(45) Date of Patent: Jul. 22, 2014

(54) METHOD AND DEVICE FOR CIRCUIT ROUTING BY WAY OF UNDER-BUMP METALLIZATION

(75) Inventor: Hsien-Wei Chen, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 392 days.

(21) Appl. No.: 13/192,172

(22) Filed: Jul. 27, 2011

(65) Prior Publication Data
US 2013/0026618 A1    Jan. 31, 2013

(51) Int. Cl.
*H01L 23/498* (2006.01)
*H01L 21/60* (2006.01)

(52) U.S. Cl.
USPC .......................................... 257/737; 438/613

(58) Field of Classification Search
CPC ... H01L 23/498; H01L 21/60; H01L 23/3192; H01L 23/525; H01L 23/5329; H01L 23/3114; H01L 2224/13022; H01L 2224/1146; H01L 2224/1134; H01L 2224/05655; H01L 2224/05166; H01L 2224/05147; H01L 2224/05008; H01L 2224/0346; H01L 2224/0345; H01L 2224/02375; H01L 2224/02235; H01L 24/13; H01L 24/05; H01L 2224/14131; H01L 2224/05569; H01L 2224/05027; H01L 2224/05572; H01L 23/53214; H01L 23/53228
USPC ............ 257/737, E23.068, E21.508; 438/613
See application file for complete search history.

(56) References Cited

U.S. PATENT DOCUMENTS

2010/0117081 A1* 5/2010 Obuchi et al. ............... 257/48
2010/0224966 A1* 9/2010 Chen .............................. 257/621
2011/0101527 A1* 5/2011 Cheng et al. ................. 257/738

OTHER PUBLICATIONS

Unpublished U.S. Appl. No. 13/117,641, filed May 27, 2011 entitled "Uniformity Control for IC Passivation Structure", 28 pages.

* cited by examiner

*Primary Examiner* — Walter H Swanson
(74) *Attorney, Agent, or Firm* — Haynes and Boone, LLP

(57) ABSTRACT

A semiconductor device includes a substrate that contains a plurality of electronic components/elements. The semiconductor device includes an interconnect structure disposed over the substrate, the interconnect structure containing a plurality of interconnect layers. The semiconductor device includes a passivation layer disposed over the interconnect structure. The semiconductor device includes an Under-Bump Metallization (UBM) layer disposed over the passivation layer, the UBM layer containing a UBM pad and a plurality of UBM devices, the UBM devices including at least one of: a UBM trace that is electrically coupled to one of the electronic components through the interconnect structure, and a dummy UBM device. The semiconductor device includes a solder bump disposed on, and electrically coupled to, the UBM pad.

20 Claims, 8 Drawing Sheets

METHOD AND DEVICE FOR CIRCUIT ROUTING BY WAY OF UNDER-BUMP METALLIZATION

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Over the course of semiconductor fabrication evolution, different packaging technologies have been proposed and implemented. For example, these packaging technologies may include wire-bonding, flip chip, and wafer-level chip scale package (WL-CSP). The WL-CSP technology (referred hereinafter as WL-CSP for the sake of simplicity) involves a wafer-level packaging scheme and mounts the semiconductor dies directly to a printed circuit board (PCB). Compared to some of the other packaging technologies, WL-CSP offers benefits such as lower costs, shorter cycle time, and small form factor. However, existing WL-CSP implementations may have less flexible circuit routing capabilities.

Therefore, while existing WL-CSP implementations are generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 7A-9A are diagrammatic fragmentary top views of a portion of an IC device according to different embodiments of the present disclosure.

FIGS. 7B-9B are diagrammatic fragmentary cross-sectional side views of a portion of an IC device according to different embodiments of the present disclosure.

DETAILED DESCRIPTION

Figure 1:
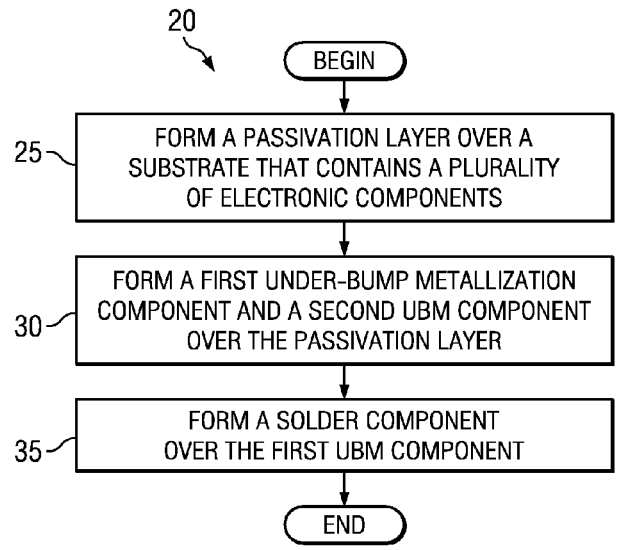
FIG. 1 is a flowchart illustrating a method of forming a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Consumer demand for smaller electronic devices has led to various miniaturization efforts in the field of semiconductor manufacturing. These miniaturization efforts include reducing the overall size of the packaging of an integrated circuit (IC) chip. For example, traditional wire-bonding packaging has gradually been replaced by flip-chip packaging and or Wafer-Level Chip Scale Package (WL-CSP). In recent years, electronic devices having a thin form factor have gained popularity. These electronic devices include mobile telephones (including smart phones), television sets, computer monitors, and tablet devices, etc. Compared to other types of IC chip packaging, one advantage offered by WL-CSP is its small (thin) form factor. Therefore, it may be desirable to employ WL-CSP in the manufacturing of the thin electronic devices.

However, existing WL-CSP technologies suffer from shortcomings in circuit routing. For example, in flip-chip packaging, an "intermediary" substrate is used to carry out circuit routing and to convert a smaller pitch (of solder bumps) of an IC chip to a larger pitch of a printed circuit board (PCB) device. This substrate is bonded between the IC chip and the PCB device. In comparison, WL-CSP removes the "intermediary" substrate and bonds the IC chip directly to the PCB board. While the loss of the "intermediary" substrate leads to a thinner form factor, it also reduces circuit routing capabilities of WL-CSP, since circuit routing now needs to be carried out in the IC chip itself. Although the IC chip has an interconnect structure dedicated for circuit routing, such interconnect structure may not be sufficient to accomplish the necessary routing objectives. For example, it may be difficult to convert the smaller pitch of the IC to a larger IC of the PCB device. For these reasons discussed above, an improved WL-CSP with better routing capabilities is desired.

Various embodiments of the present disclosure improve WL-CSP routing capabilities through the efficient use of an Under-Bump Metallization (UBM) layer. FIG. 1 is a flowchart illustrating a method 20 of performing a WL-CSP packaging process according to various aspects of the present disclosure. The method 20 includes a block 25, in which a passivation layer is formed over a substrate that contains a plurality of electronic components. The method 20 includes a block 30, in which a first Under-Bump Metallization (UBM) component and a second UBM component are formed over the passivation layer. The first UBM component includes a UBM pad. The second UBM component includes one of: a UBM trace that is electrically coupled to at least one of the electronic components, and a dummy UBM component. The method 20 includes a block 35, in which a solder component is formed over the first UBM component.

Figure 2:
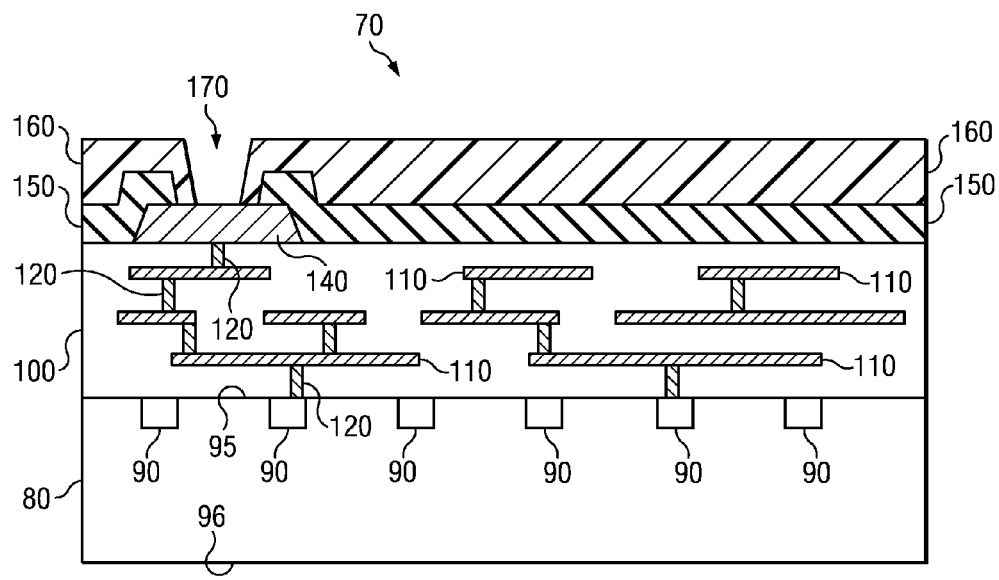
FIGS. 2-6 are diagrammatic fragmentary cross-sectional side views of a portion of an IC device at different stages of fabrication according to aspects of the present disclosure.

FIGS. 2-6 are simplified cross-sectional views of a semiconductor device at various stages of fabrication according to various aspects of the present disclosure. Referring to FIG. 2, a diagrammatic fragmentary cross-sectional side view of a portion of an IC device 70 is illustrated according to an embodiment of the present disclosure. The IC device 70 includes a substrate 80 (also referred to as a wafer). The substrate 80 is a silicon substrate doped with a p-type dopant such as boron (for example a p-type substrate). Alternatively, the substrate 80 could be another suitable semiconductor material. For example, the substrate 80 may be a silicon substrate that is doped with an n-type dopant such as phosphorous or arsenic (an n-type substrate). The substrate 80 could include other elementary semiconductors such as germanium and diamond. The substrate 80 could optionally include a compound semiconductor and/or an alloy semiconductor. Further, the substrate 80 could include an epitaxial layer (epi layer), may be strained for performance enhancement, and may include a silicon-on-insulator (SOI) structure.

A plurality of electronic components 90 are formed in or on the substrate 80. These electronic components 90 may include active components such as Field Effect Transistors (FETs) or Bipolar Junction Transistors (BJTs), or passive components such as resistors, capacitors, or inductors. The IC device 70 may include millions or billions of these electronic components, but only a few are shown in FIG. 2 for the sake of simplicity.

The substrate 80 has a front side 95 (or front surface) and a back side (or back surface) 96. An interconnect structure 100 is formed over the front side of the substrate 80. The interconnect structure 100 may also be considered a part of the substrate 80. The interconnect structure 100 includes a plurality of patterned dielectric layers and conductive layers that provide interconnections (e.g., wiring) between the various doped features, circuitry, and input/output of the IC device 70. For example, the interconnect structure 100 includes an interlayer dielectric (ILD) and a multilayer interconnect (MLI) structure. The MLI structure includes contacts, vias and metal lines. For purposes of illustration, a plurality of conductive lines 110 (also referred to as metal lines or metal interconnects) and vias/contacts 120 are shown in FIG. 2, it being understood that the conductive lines 110 and vias/contacts 120 illustrated are merely exemplary, and the actual positioning and configuration of the conductive lines 110 and vias/contacts 120 may vary depending on design and manufacturing needs.

The MLI structure may contain conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 120) and horizontal connection (for example, conductive lines 110). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

A plurality of conductive pads 140 are formed over the interconnect structure 100. The conductive pads 140 include a metal material in the present embodiment, for example Aluminum (Al), but may include other conductive materials in alternative embodiments. The conductive pads 140 are each electrically coupled to at least one of the electronic components 90, so that electrical connections between the electronic components 90 and external devices may be established. The coupling may be done through one or more conductive lines 110 and one or more vias 120 in the interconnect structure 100. For the sake of simplicity, only one of such conductive pads 140 is shown in FIG. 2.

A passivation layer 150 is then formed over the interconnect structure 100 and over the conductive pads 140. The passivation layer 150 includes a silicon nitride or a silicon oxide material, or combinations thereof. The passivation layer 150 is formed by a process that may include chemical vapor deposition (CVD), physical vapor deposition (PVD), atomic layer deposition (ALD), combinations thereof, or another suitable process. The passivation layer 150 provides a sealing function for the various features and devices of the IC device 70, so that they are less likely to be eroded or damaged by external components. For example, the passivation layer 150 prevents moisture, dust, and other contaminant particles from reaching inside the IC device 70, which may degrade the performance of the IC device 70 and/or shorten its lifespan. In an embodiment, the passivation layer 150 has a thickness that is in a range between about 8 um and about 30 um.

A polymer layer 160 is formed over the passivation layer 150. The polymer layer 160 includes polymers of imide monomers, for example pyromellitic dianhydride monomers. Hence, the polymer layer 160 may also be referred to as a polyimide layer 160. In an embodiment, the polymer layer 160 has a thickness that is in a range between about 5 um and about 30 um. A plurality of trenches or openings may be formed in portions of the polymer layer 160 and the passivation layer 150 over the conductive pads 140, for example through a wet etching or a dry etching process. For the sake of simplicity, only one of such trenches is illustrated herein as trench 170.

Figure 3:
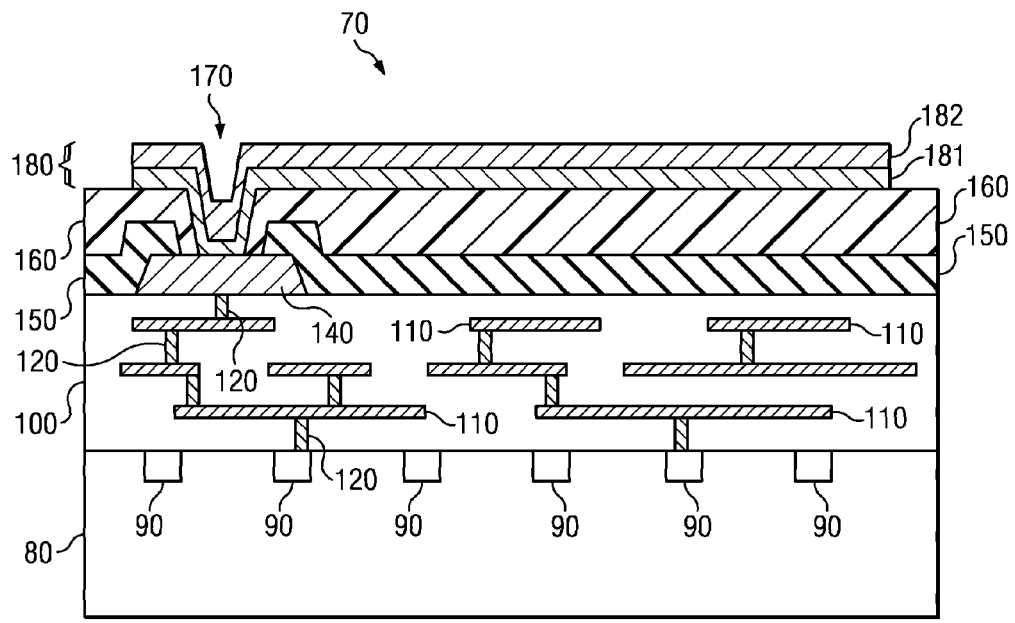

Referring now to FIG. 3, a plurality post-passivation interconnect (PPI) devices 180 may be formed over the polymer layer 160, portions of which fill the respective trenches formed above the conductive pads 140. For the sake of simplicity, only one such PPI device 180 is illustrated herein. The PPI devices 180 include a conductive material, for example copper (Cu), and may be formed by a suitable deposition process known in the art. In the illustrated embodiment, the PPI device 180 includes a sputtering layer 181 (formed by a sputtering process) and a plating player 181 (formed by a plating process) disposed on the sputtering layer.

Figure 4:
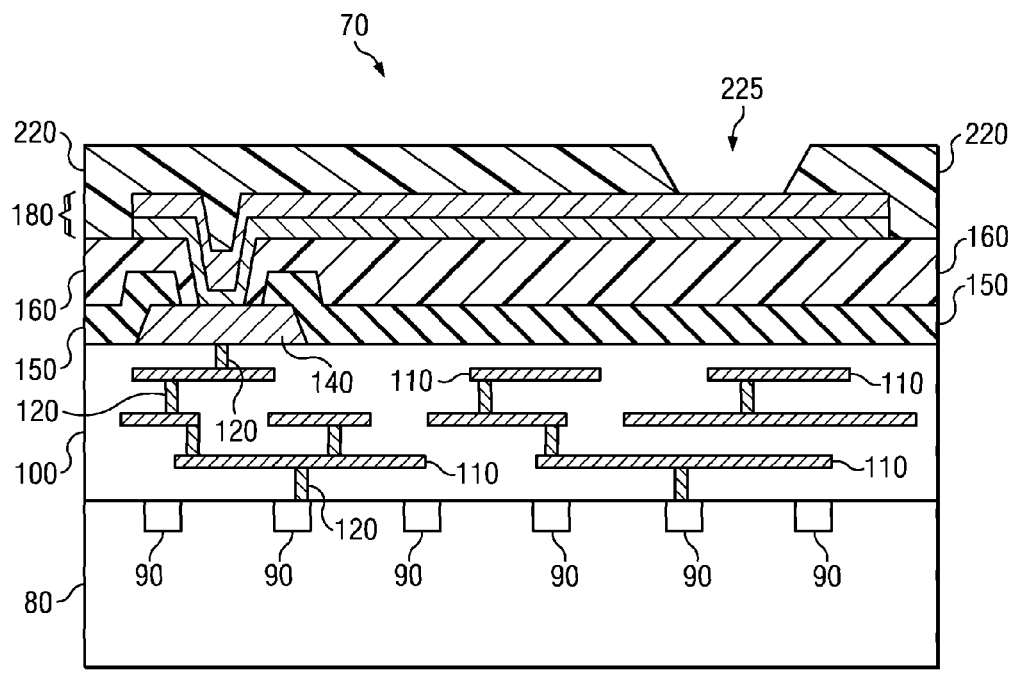

Referring now to FIG. 4, another polymer layer 220 is formed over the polymer layer 160 and over the PPI device 180. In an embodiment, the polymer layer 220 has a thickness that is in a range between about 5 um and about 30 um. The polymer layer 220 may include polymers of imide monomers as well. Alternatively, the polymer layer 220 may include a polymer material different from the material of the polymer layer 160. A plurality of trenches or openings is formed in portion of the polymer layer 220 overlying the PPI devices 180. For the sake of simplicity, one of such trenches is shown herein as trench 225.

Figure 5:
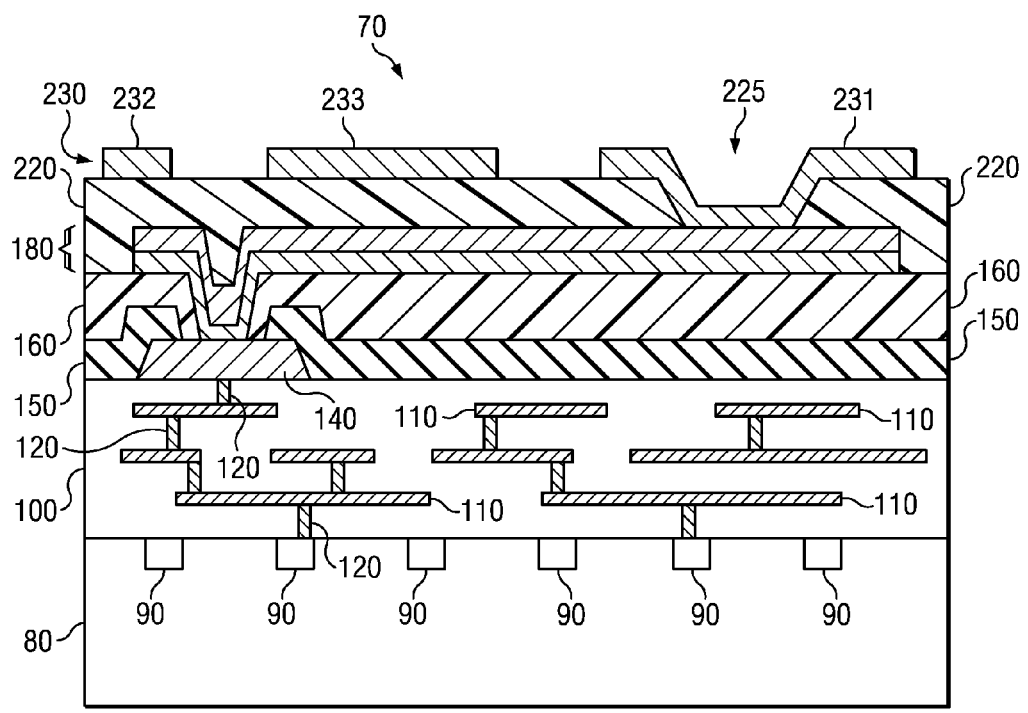

Referring now to FIG. 5, an Under-Bump Metallization layer (UBM layer) 230 is formed over the polymer layer 220. The UBM layer 230 includes a plurality of components, some of which are illustrated herein as components 231-233. These components 231-233 are formed by forming one or more conductive layer and then performing one or more patterning processes (e.g., photolithography processes) to the conductive layers. In the embodiment illustrated herein, the component 231 at least partially fills the trench 225. The component 231 is a metal pad on which a solder component (such as a solder ball or a solder bump) will be formed in a later process. As such, the component 231 may be referred to as a UBM pad. The other components 232-233 may be used for other purposes. In one embodiment, the components 232-233 may be used in a manner similar to a metal line or metal trace to carry out circuit routing. In another embodiment, the components 232-233 are dummy components and may be used to improve distribution uniformity of the UBM layer 230. In further embodiments, the components 232-233 may contain both functional metal traces as well as dummy components, thereby carrying out circuit routing and improving the distribution uniformity. These various embodiments will be discussed in more detail later with reference to FIGS. 7-10.

Still referring to FIG. 5, UBM layer 230 contains a plurality of metal layers to provide adequate adhesion to the conductive pads 180 therebelow and to provide protection for the underlying materials. In one embodiment, the UBM layer 230 may be formed by forming a titanium layer on the polymer layer 220 using a sputtering process, followed by forming a first copper layer on the titanium layer using a sputtering process, followed by forming a second copper layer on the first copper layer using a plating process. The titanium layer has a thickness in a range from about 0.4 kilo-Angstroms (KA) to about 0.6 KA. The first copper layer (formed by the sputtering process) has a thickness in a range from about 2 KA to about 4 KA. The second copper layer (formed by the plating process) has a thickness in a range from about 2 microns (um) to about 10 um. In this embodiment, a ball mount process may be used to form the solder component on the UBM pad 231.

In another embodiment, the UBM layer 230 may be formed by forming a titanium layer on the polymer layer 220 using a sputtering process, followed by forming a first copper layer on the titanium layer using a sputtering process, followed by forming a second copper layer on the first copper layer using a plating process, followed by forming a nickel layer on the second copper layer using a plating process. The titanium layer has a thickness in a range from about 0.4 KA to about 0.6 KA. The first copper layer (formed by the sputtering process) has a thickness in a range from about 2 KA to about 4 KA. The second copper layer (formed by the plating process) has a thickness in a range from about 1 um to about 3 um. The nickel layer has a thickness in a range from about 0.2 um to about 0.4 um. In this embodiment, a plating ball process may be used to form the solder component on the UBM pad 231.

Figure 6:
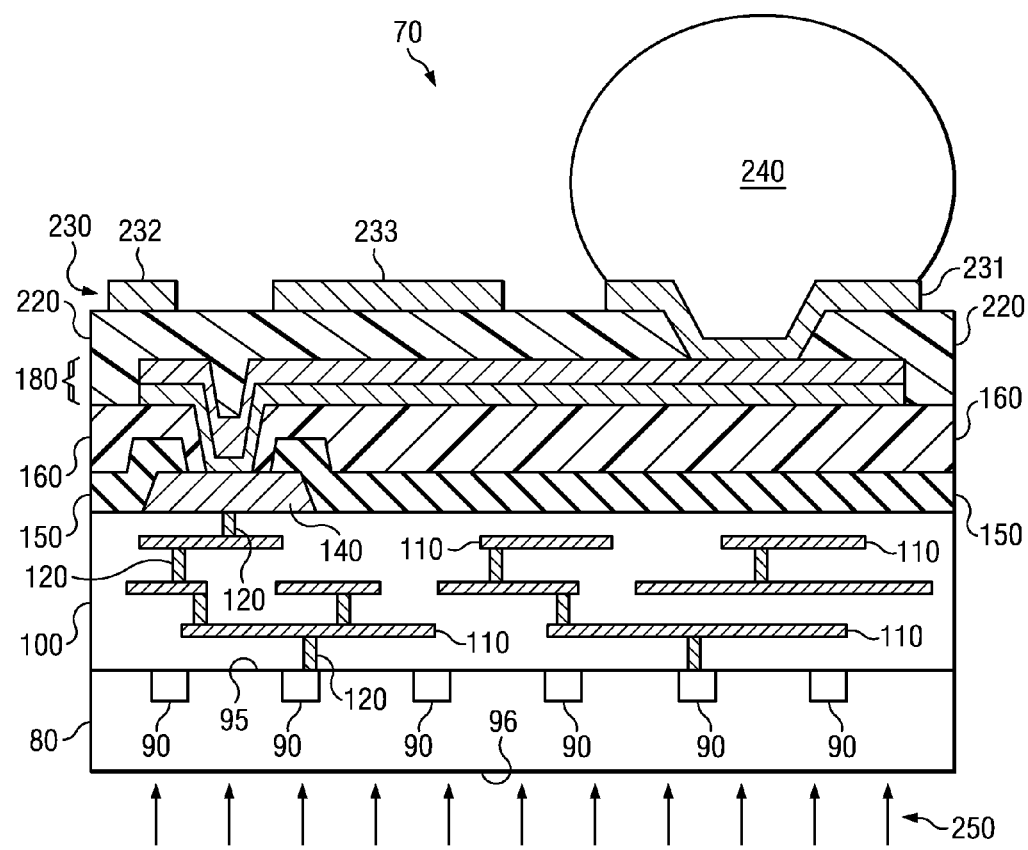

Referring now to FIG. 6, a plurality of solder components are formed on (and is thus electrically coupled to) the UBM pads 231. In some embodiments, the solder components are directly formed on the UBM pads 231. For the sake of simplicity, one of such solder components 240 is illustrated herein. In an embodiment, the solder component 240 includes a solder ball or a solder bump, which may be formed in a ball mount process or a plating process. In an embodiment, the solder component 240 includes metal materials, for example, lead (Pb). The solder component 240 allows external devices to be electrically coupled to (or gain electrical access to) the electronic components 90. Hence, the solder component 240 serves as a conductive terminal of the IC device 70. According to an embodiment, a wafer backside grinding process 250 may be performed to thin the substrate 80 from the back side 96. In other words, the thickness of the substrate is reduced from the back side 96. A laser mark process may also be performed.

Figure 7A:
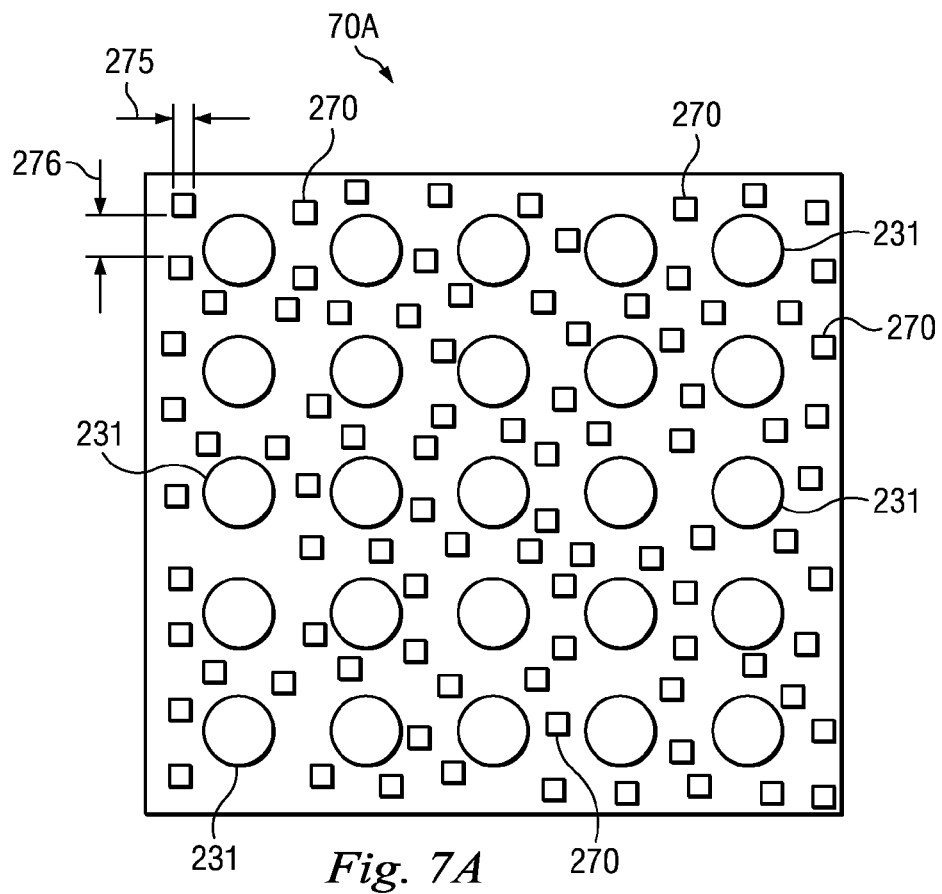
Figure 7B:
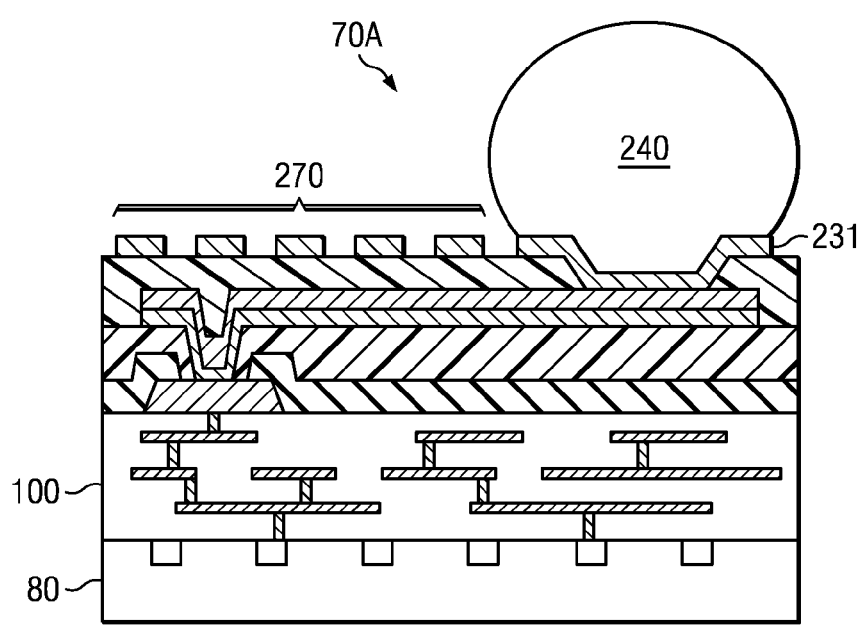

FIGS. 7A and 7B are a simplified top view and a simplified cross-sectional view, respectively, of a portion of an IC device 70A according to one embodiment of the present disclosure. The cross-sectional view of the IC device 70A is similar to the IC device 70 shown in FIG. 6, and as such, some of the components are labeled the same, while others are not labeled in FIG. 7B for the sake of simplicity. It is also understood that FIGS. 7A and 7B do not necessarily correspond to each other, as they are each a fragmentary view showing only a portion of the IC device 70A.

As FIGS. 7A and 7B clearly show, the IC device 70A contains a plurality of dummy UBM components 270. The dummy UBM components 270 are formed along with the UBM pad 231. In other words, these dummy UBM components 270 are formed using the same processes and the same materials as the UBM pad 231, as discussed above. In an embodiment, the dummy UBM components 270 are not electrically coupled to any of the electronic components 90 in the substrate 80. The dummy UBM components 270 are used to enhance the distribution uniformity of the UBM layer. Had the dummy UBM components 270 not been formed, the distribution density (UBM material-per-chip area) of the UBM layer would rise near the UBM pads 231 and fall away from the UBM pads 231. In other words, the distribution density of the UBM layer would be uneven and non-uniform, which may lead to poor packaging reliability of the IC device. For example, the IC device may suffer from cracking or peeling issues. These cracking and peeling issues would result in inadequate sealing of the IC device. The non-uniformity may also degrade electrical performance of the IC device.

Here, the dummy UBM components 270 and the UBM pads 231 (under the solder ball 240) are formed using the same processes and contain the same (or substantially similar) materials. Therefore, they can be collectively considered a part of an overall UBM layer with respect to IC topography. In this manner, it is as if the UBM pads have been formed relatively uniformly throughout the IC device 70A. This is because although the functional UBM pads 231 have only been formed at selected areas of the IC device 70A, the dummy UBM components 270 have been formed in other parts of the IC device 70A not occupied by the functional UBM pads 231.

The dummy UBM components 270 may assume any polygonal shape, for example, a square shape. In an embodiment, the dummy UBM components 270 have lateral dimensions 275 that are each greater than or equal to about 10 um, and the dummy UBM components 270 are spaced apart from adjacent dummy UBM components by respective distances 276 that are each greater than or equal to about 10 um. The distribution of the dummy UBM components 270 may also be random or follow a predetermined pattern. In an embodiment, the distribution density of the dummy UBM pads 270 may be in a range from about 30% to about 60%.

Figure 8A:
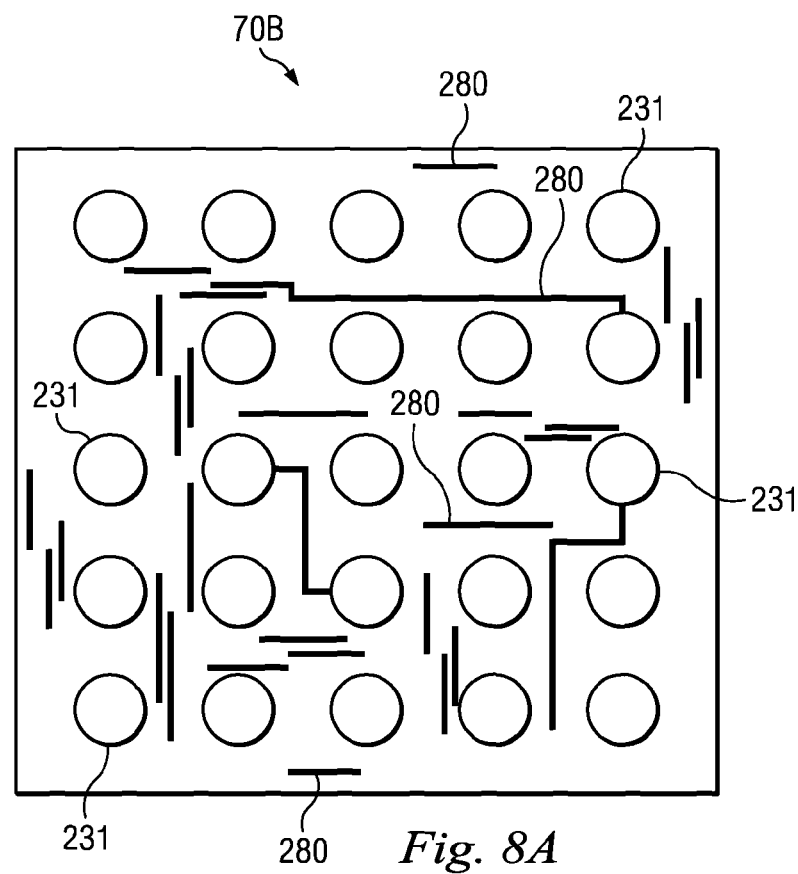
Figure 8B:
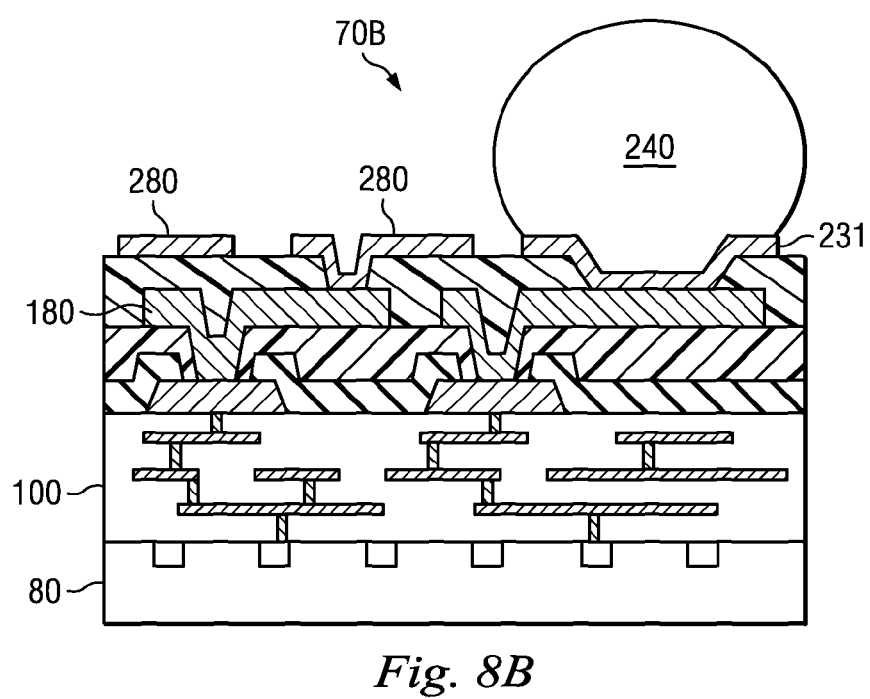

FIGS. 8A and 8B are a simplified top view and a simplified cross-sectional view, respectively, of a portion of an IC device 70B according to another embodiment of the present disclosure. The cross-sectional view of the IC device 70B is similar to the IC device 70 shown in FIG. 6, and as such, some of the components are labeled the same, while others are not labeled in FIG. 8B for the sake of simplicity. It is also understood that FIGS. 8A and 8B do not necessarily correspond to each other, as they are each a fragmentary view showing only a portion of the IC device 70B.

In the embodiment shown in FIGS. 8A-8B, the IC device 70B contains functional UBM components 280 that serve as metal lines or metal traces for circuit routing purposes. These UBM components 280 and the UBM pads 231 (under the solder ball 240) are formed using the same processes and contain the same (or substantially similar) materials. Therefore, they can be collectively considered a part of an overall UBM layer. One or more of the UBM components may be electrically coupled to a PPI device 180 therebelow, and/or may be electrically coupled to one of the solder balls 240. In this manner, the UBM components 280 function in a manner similar to the metal layers in the interconnect structure 100. Stated differently, at least one additional circuit routing layer is gained through the use of the UBM components 280. In the embodiment illustrated herein, the UBM components 280 may have elongate shapes. Other suitable shapes may be used in alternative embodiments.

Figure 9A:
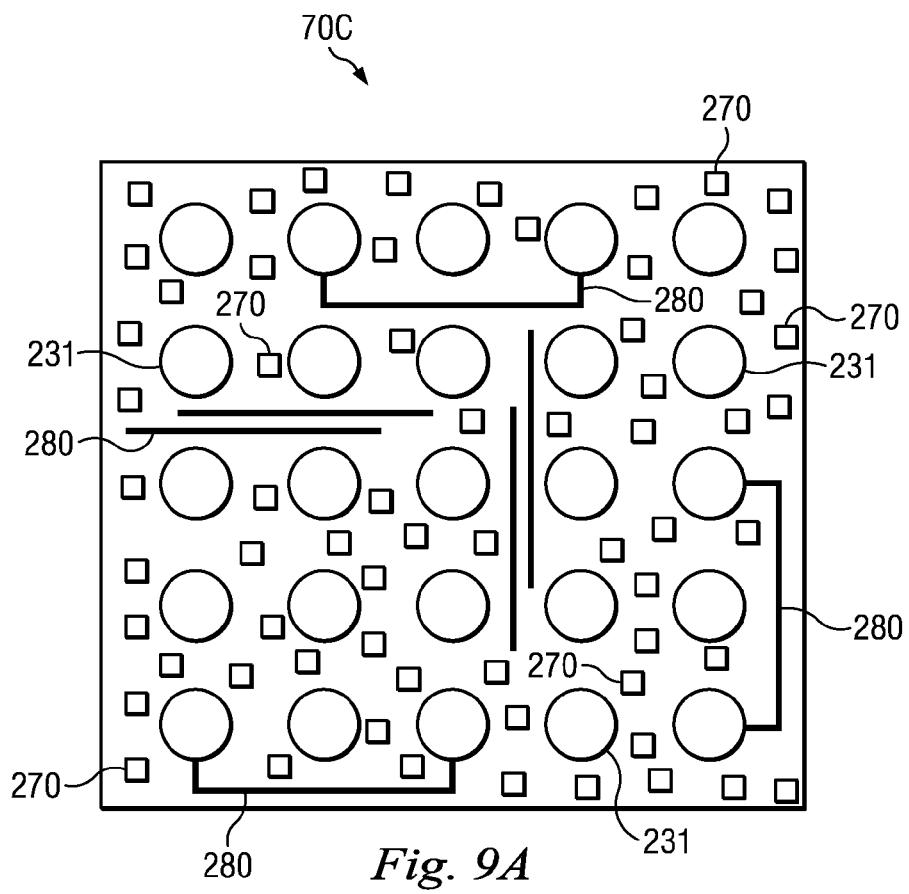
Figure 9B:
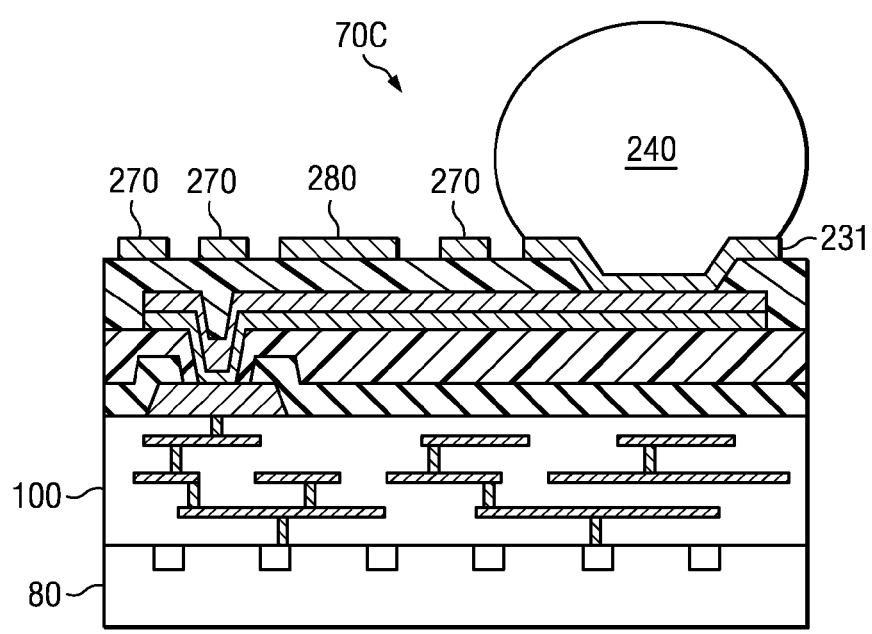

FIGS. 9A and 9B are a simplified top view and a simplified cross-sectional view, respectively, of a portion of an IC device 70C according to yet another embodiment of the present disclosure. The cross-sectional view of the IC device 70C is similar to the IC device 70 shown in FIG. 6, and as such, some of the components are labeled the same, while others are not labeled in FIG. 9B for the sake of simplicity. It is also understood that FIGS. 9A and 9B do not necessarily correspond to each other, as they are each a fragmentary view showing only a portion of the IC device 70C.

In the embodiment shown in FIGS. 9A-9B, the IC device 70C contains both the dummy UBM components 270 and the functional UBM components 280. Hence, the embodiment shown in FIGS. 9A-9B may be viewed as a combination of the embodiments of FIGS. 7A-7B and FIGS. 8A-8B. As such, the IC device 70C can improve UBM layer distribution uniformity through the dummy UBM components 270, as well as perform circuit routing through the functional UBM components 280.

Figure 10:
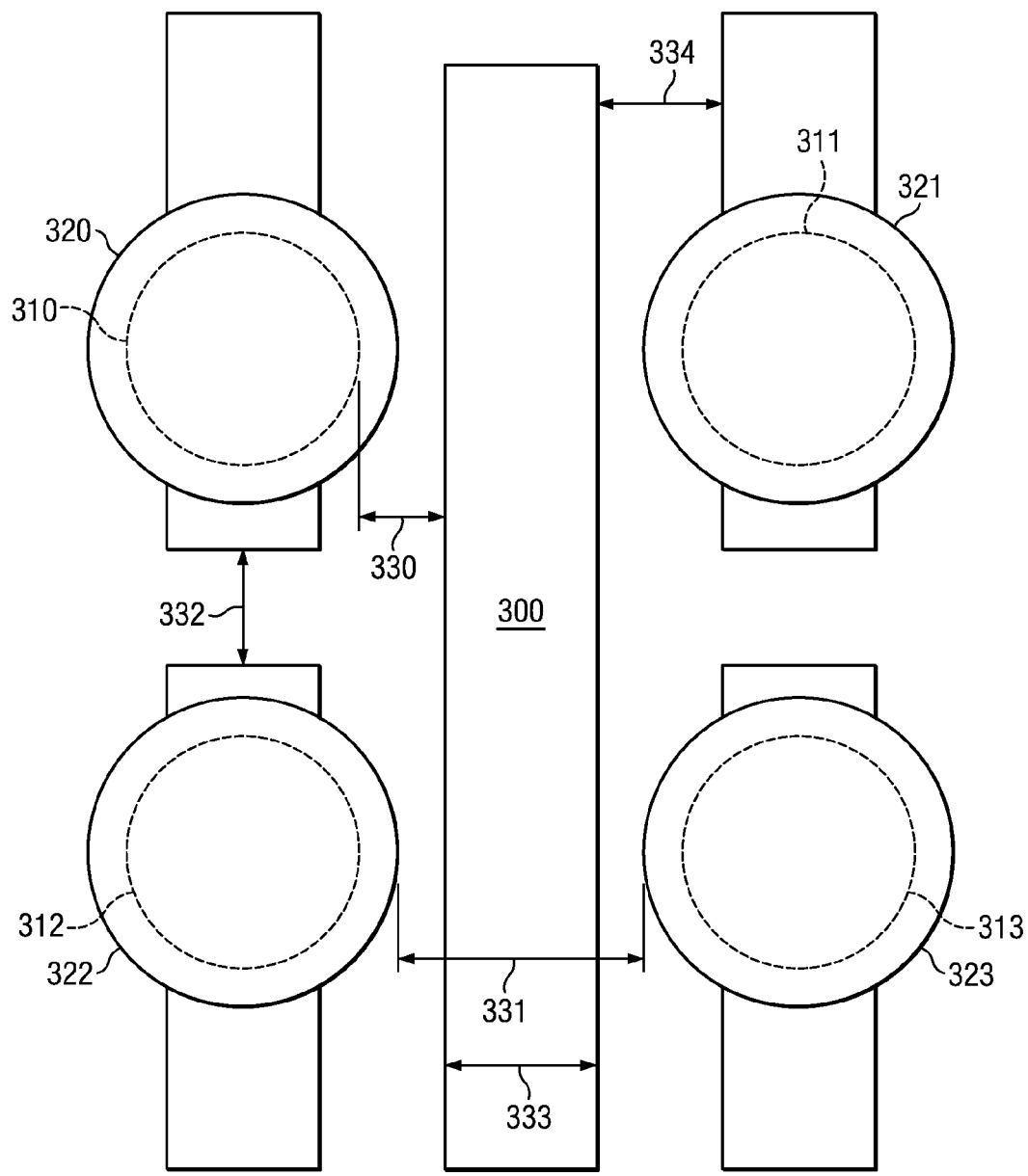
FIG. 10 is a simplified top view of a portion of an IC device in more detail.

To effectively carry out circuit routing using the UBM components 280, a set of design or layout rules need to be followed. Referring now to FIG. 10, a simplified top view of a portion of an IC device is illustrated. Specifically, the top view of FIG. 10 shows an example UBM trace 300 (similar to the UBM components 280 illustrated in FIGS. 8A-8B and 9A-9B) as well as UBM pads 310-313 (similar to the UBM pad 231). Top views of solder balls 320-323 (similar to the solder balls 240) are shown superimposed over their respective UBM pads 310-313.

The UBM trace 300 is spaced apart from adjacent UBM pads by a distance 330 (may also be referred to as a Trace to ball PAD distance). The solder balls 310-313 are spaced apart from adjacent solder balls by a distance 331 (also referred to as ball spacing). Aligned UBM traces are spaced apart (in the direction of alignment) by a distance 332 (also referred to as head-tail spacing). The UBM trace 300 has a lateral distance (or width) 333. Adjacent UBM traces are spaced apart by a distance 334. The values of the distances 330-334 may vary depending on the size or dimension of the solder balls 310-313. These values are summarized in Table 1 below.

TABLE 1

| Ball pitch/UBM size: 400/240 um | | Solder Ball Size (um) | | |
|---|---|---|---|---|
| | | 250 | 280 | 300 |
| Distance 330 | Trace to Ball PAD distance (um) | >=20 | >=20 | >=20 |
| Distance 331 | Ball spacing (um) | 150 | 120 | 100 |
| Distance 332 | Head-Tail spacing (um) | >=20 | >=20 | >=20 |
| Distance 333 | Copper width (um) | >=10 | >=10 | >=10 |
| Distance 334 | Copper spacing (um) | >=10 | >=10 | >=10 |

For example, when the solder ball size is 250 um, the distance 330 (Trace to Ball Pad distance) is greater than or equal to about 20 um, and the distance 331 (Ball spacing) is about 150 um, so on and so forth.

The various embodiments of the present disclosure discussed above offer advantages over conventional WL-CSP ICs, it being understood that no particular advantage is required for all embodiments, and that different embodiments may offer different advantages. One of the advantages is that metal traces may be formed in the UBM layer to perform circuit routing. By doing this, the present disclosure obviates the need for a dedicated intermediary substrate that would have been required for other packaging technologies, such as flip-chip package IC devices. Also, since the UBM traces are formed using the same process that forms the UBM pads, no extra costs are incurred, and no extra processing time is needed.

Another advantage offered by the embodiments of the present disclosure involves improvements in distribution uniformity. As discussed above, the dummy UBM components may be used to make the distribution of the UBM material more uniform throughout the IC. The improved distribution uniformity may lead to less peeling or cracking issues, and may enhance electrical performance of the IC device. Also, these dummy UBM components need not be electrically coupled to electronic components inside or outside the IC device and therefore will not interfere with the intended electrical operation of the IC device. In addition, the formation of the dummy UBM components requires no extra fabrication processes either.

One of the broader forms of the present disclosure involves a semiconductor device. The semiconductor device includes: a substrate that contains a plurality of electronic components; a passivation layer disposed over the substrate; a first conductive component and a second conductive component each disposed over the passivation layer, wherein a material composition of the first conductive component is substantially similar to a material composition of the second conductive component; and a solder component that is disposed directly on the first conductive component, the solder component being electrically coupled to the first conductive component. The second conductive component is free of a formation of any solder component thereon.

In an embodiment, the first and second conductive components are each formed in an Under-Bump Metallization (UBM) layer.

In an embodiment, the first conductive component is a UBM pad.

In an embodiment, the second conductive component includes a dummy UBM device that is free of electrical coupling to any of the electronic components.

In an embodiment, the second conductive component includes a metal line that is electrically coupled to at least one of the electronic components.

In an embodiment, the semiconductor device includes an interconnect structure disposed over the substrate, the interconnect structure including a plurality of vias and interconnect lines; a plurality of conductive pads disposed between the interconnect structure and the passivation layer, the conductive pads being at least partially sealed by the passivation layer; and a polymer layer disposed the passivation layer, wherein the first and second conductive components are disposed over the polymer layer.

In an embodiment, the semiconductor device includes a plurality of post-passivation interconnect (PPI) components disposed between the passivation layer and the polymer layer.

In an embodiment, the first and second conductive components each include a titanium layer and a copper layer, the copper layer being disposed on the titanium layer.

In an embodiment, the first and second conductive components each include a titanium layer, a copper layer, and a nickel layer, the copper layer being disposed between the titanium layer and the nickel layer.

Another one of the broader forms of the present disclosure involves a semiconductor device. The semiconductor device includes: a substrate that contains a plurality of electronic components; an interconnect structure disposed over the substrate, the interconnect structure containing a plurality of interconnect layers; a passivation layer disposed over the interconnect structure; an Under-Bump Metallization (UBM) layer disposed over the passivation layer, the UBM layer containing a UBM pad and a plurality of UBM devices, the UBM devices including at least one of: a UBM trace that is electrically coupled to one of the electronic components through the interconnect structure, and a dummy UBM device; and a solder bump disposed directly on, and electrically coupled to, the UBM pad. At least a subset of the plurality of the UBM devices have no solder bumps formed thereon.

In an embodiment, the UBM pad and the UBM devices have substantially identical material compositions.

In an embodiment, the semiconductor device includes a plurality of post-passivation interconnect (PPI) devices disposed between the passivation layer and a polymer layer; and wherein: the UBM layer is formed on the polymer layer; the UBM pad is electrically coupled to at least one of the PPI devices; the UBM trace is electrically coupled to at least one of the PPI devices; and the dummy UBM device is free of electrical coupling to any of the PPI devices.

In an embodiment, the UBM pad and the plurality of UBM devices each contain a titanium material and a copper material.

Yet another one of the broader forms of the present disclosure involves a method of fabricating a semiconductor device. The method includes: forming a passivation layer over a substrate that contains a plurality of electronic components; forming a first Under-Bump Metallization (UBM) component and a second UBM component over the passivation layer, wherein the first UBM component includes a UBM pad, and wherein the second UBM component includes one of: a UBM trace that is electrically coupled to at least one of the electronic components, and a dummy UBM component; and forming a solder component over the first UBM component but not over the second UBM component.

In an embodiment, the method further includes: before the forming the passivation layer, forming a metal pad over the substrate, the metal pad being electrically coupled to one of the electronic components, wherein the passivation layer is formed over the metal pad; after the forming the passivation layer, forming a opening in the passivation layer, the opening exposing the metal pad; and forming a post-passivation interconnect (PPI) device over the passivation layer, the PPI device at least partially filling the opening and being electrically coupled to the metal pad.

In an embodiment, the forming the first UBM component is carried out in a manner such that the first UBM component is electrically coupled to the metal pad through the PPI device.

In an embodiment, the method further includes: before the forming the first UBM component and the second UBM component, forming a polymer layer over the passivation layer; and wherein the forming the first UBM component and the second UBM component includes: forming a titanium layer over the polymer layer using a first sputtering process; forming a first copper layer over the titanium layer using a second sputtering process; and forming a second copper layer over the first copper layer using a first plating process.

In an embodiment, the method further includes: forming a nickel layer over the second copper layer using a second plating process.

In an embodiment, the forming the first UBM component and the second UBM component and the forming the solder component are carried out in a manner such that: the first UBM component is located underneath and is in direct contact with the solder component; and the first and second UBM components are formed using identical fabrication processes.

In an embodiment, the providing the substrate is carried out in a manner such that the substrate has a front side and a back side, and wherein the substrate contains an interconnect structure formed on the front side, the interconnect structure containing a plurality of vias and interconnect lines; and further including, after the forming the first and second UBM components: thinning the substrate from the back side.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a substrate that contains a plurality of electronic components;
   an interconnect structure disposed over the substrate, the interconnect structure including a plurality of vias and interconnect lines;
   a passivation layer disposed over the interconnect structure;
   a plurality of conductive pads disposed between the interconnect structure and the passivation layer, the conductive pads being at least partially sealed by the passivation layer;
   a polymer layer disposed over the passivation layer;
   a plurality of post-passivation interconnect (PPI) components disposed between the passivation layer and the polymer layer;
   a first conductive component and a second conductive component each disposed over the polymer layer, wherein a material composition of the first conductive component is substantially similar to a material composition of the second conductive component;
   a solder component that is disposed on the first conductive component, the solder component being electrically coupled to the first conductive component;
   wherein the second conductive component is free of a formation of any solder component thereon.

2. The semiconductor device of claim 1, wherein the first and second conductive components are each formed in an Under-Bump Metallization (UBM) layer.

3. The semiconductor device of claim 2, wherein the first conductive component is a UBM pad.

4. The semiconductor device of claim 2, wherein the second conductive component includes a dummy UBM device that is free of electrical coupling to any of the electronic components.

5. The semiconductor device of claim 2, wherein the second conductive component includes a metal line that is electrically coupled to at least one of the electronic components.

6. The semiconductor device of claim 1, wherein the first and second conductive components each include a titanium layer and a copper layer, the copper layer being disposed on the titanium layer.

7. The semiconductor device of claim 1, wherein the first and second conductive components each include a titanium layer, a copper layer, and a nickel layer, the copper layer being disposed between the titanium layer and the nickel layer.

8. A semiconductor device, comprising:
- a substrate that contains a plurality of electronic components;
- an interconnect structure disposed over the substrate, the interconnect structure containing a plurality of interconnect layers;
- a passivation layer disposed over the interconnect structure;
- an Under-Bump Metallization (UBM) layer disposed over the passivation layer, the UBM layer containing a UBM pad and a plurality of UBM devices, the UBM devices including at least one of: a UBM trace that is electrically coupled to one of the electronic components through the interconnect structure, and a dummy UBM device; and
- a solder bump disposed on the UBM pad and electrically coupled to the UBM pad;
- wherein at least a subset of the plurality of the UBM devices have no solder bumps formed thereon.

9. The semiconductor device of claim 8, wherein the UBM pad and the UBM devices have substantially identical material compositions.

10. The semiconductor device of claim 8, further including: a plurality of post-passivation interconnect (PPI) devices disposed between the passivation layer and a polymer layer; and wherein:
- the UBM layer is formed on the polymer layer;
- the UBM pad is electrically coupled to at least one of the PPI devices;
- the UBM trace is electrically coupled to at least one of the PPI devices; and
- the dummy UBM device is free of electrical coupling to any of the PPI devices.

11. The semiconductor device of claim 8, wherein the UBM pad and the plurality of UBM devices each contain a titanium material and a copper material.

12. A semiconductor device, comprising:
- a substrate that contains a plurality of electronic elements;
- a passivation layer disposed over the substrate;
- an Under-Bump Metallization (UBM) layer disposed over the passivation layer, wherein the UBM layer includes a first conductive element and a second conductive element, the first conductive element and the second conductive element having substantially similar material compositions, and wherein the second conductive element includes a metal line that is electrically coupled to at least one of the electronic elements; and
- a solder element that is disposed directly on the first conductive element, the solder element being electrically coupled to the first conductive element, and wherein no portion of the solder element is disposed on the second conductive element.

13. The semiconductor device of claim 12, wherein the first conductive element is a UBM pad.

14. The semiconductor device of claim 12, wherein the second conductive element includes a dummy UBM device that is free of electrical coupling to any of the electronic elements.

15. The semiconductor device of claim 12, further including an interconnect structure disposed over the substrate, the interconnect structure including a plurality of vias and interconnect lines.

16. The semiconductor device of claim 15, further including a plurality of conductive pads disposed between the interconnect structure and the passivation layer, the conductive pads being at least partially sealed by the passivation layer.

17. The semiconductor device of claim 16, further including a polymer layer disposed over the passivation layer, wherein the first and second conductive elements are disposed over the polymer layer.

18. The semiconductor device of claim 17, further including a plurality of post-passivation interconnect (PPI) elements disposed between the passivation layer and the polymer layer.

19. The semiconductor device of claim 12, wherein the first and second conductive elements each include a titanium layer and a copper layer, the copper layer being disposed on the titanium layer.

20. The semiconductor device of claim 12, wherein the first and second conductive elements each include a titanium layer, a copper layer, and a nickel layer, the copper layer being disposed between the titanium layer and the nickel layer.

* * * * *